United States Patent [19]
Kokubun

[11] Patent Number: 5,675,171
[45] Date of Patent: Oct. 7, 1997

[54] INTEGRATED INSULATED GATE FIELD EFFECT TRANSISTORS WITH THIN INSULATION REGION BETWEEN FIELD INSULATION REGIONS

[75] Inventor: Tetsuya Kokubun, Tokyo, Japan

[73] Assignee: NEC Corporation, Tokyo, Japan

[21] Appl. No.: 634,814

[22] Filed: Apr. 19, 1996

[30] Foreign Application Priority Data

Apr. 20, 1995 [JP] Japan .................................. 7-095455

[51] Int. Cl.[6] ................................................ H01L 27/092
[52] U.S. Cl. ........................ 257/400; 257/372; 257/398
[58] Field of Search ................................ 257/394–400, 257/372, 921

[56] References Cited

U.S. PATENT DOCUMENTS

| | | | |
|---|---|---|---|
| 4,406,710 | 9/1983 | Davies et al. | 257/372 |
| 4,443,811 | 4/1984 | Tubbs et al. | 257/372 |
| 4,458,262 | 7/1984 | Chao | 257/399 |
| 4,591,890 | 5/1986 | Lund et al. | 257/398 |
| 4,748,489 | 5/1988 | Komatsu | 257/372 |
| 4,990,983 | 2/1991 | Custode et al. | 257/398 |
| 5,220,192 | 6/1993 | Owens et al. | 257/921 |

Primary Examiner—Gene M. Munson

[57] ABSTRACT

Disclosed is a semiconductor device, which has: a first device-separating insulating film which is formed on a semiconductor substrate and extends in a first(Y) direction; a second device-separating insulting film which is formed on said semiconductor substrate and extends in a second(X) direction normal to the first(Y) direction; a first-conductivity-type device region which is formed on the semiconductor substrate and is sectioned by the first and second device-separating insulating films; and a first first-conductive-type high concentration impurity layer which is formed under the first device-separating insulating film and extends in the first(Y) direction; wherein the second device-separating insulating film is connected with the first device-separating insulating film through an insulating film thinner than both the first and second device-separating insulating films, the thin insulating film extending over the first high concentration impurity layer to separate the device region arranged in the second(X) direction from each other by the first device-separating insulating film and the first high concentration impurity layer, and the device region arranged in the first(Y) direction is separated by the second device-separating insulating film and the thin insulating film.

6 Claims, 5 Drawing Sheets

INTEGRATED INSULATED GATE FIELD EFFECT TRANSISTORS WITH THIN INSULATION REGION BETWEEN FIELD INSULATION REGIONS

FIELD OF THE INVENTION

This invention relates to a semiconductor device, and more particularly to, a semiconductor device which is applied to the use under the radiation environment as in space.

BACKGROUND OF THE INVENTION

In a LSI with an insulated-gate field-effect transistor (hereinafter referred to as 'NMOS', 'PMOS' and 'CMOS' for n-channel, p-channel and complementary type MOS transistors, respectively) which is used under the radiation environment as in space, the degradation of characteristics such as threshold voltage shifts or increase in leakage current may be occurred by the radiation. It is caused by the accumulation of the fixed positive charge in silicon oxide film or the increase in the interface state density of the oxide film-silicon interface.

It is known that the accumulation amount of the fixed positive charge increases in proportion to the thickness of oxide film. Namely, the amount of the fixed positive charge in thick field oxide film is greater than that in thin gate oxide film.

In a n-channel type parasitic transistor which is formed through field oxide film, the fixed positive charge is accumulated in the oxide film by radiation to reduce the threshold voltage thereof to increase leakage current. The leakage current flowing between adjacent NMOSs or between NMOS and n-type well is caused by the reduction in the threshold voltage of the parasitic transistor through the thick field oxide film.

Japanese patent application laid-open No. 62-5654 discloses a semiconductor device which comprises a device separating region which comprises thick field oxide films, thin oxide film formed between the thick field oxide films, $p^+$-type impurity regions formed under the thick field oxide films, and $p^{++}$-type impurity region formed under the thin oxide film. The device separating region completely surrounds each device region. Therefore, even when radioactive rays are radiated thereon, a fixed positive charge is not so accumulated at the thin oxide film. In addition, the $p^{++}$-type impurity region is formed under the thin oxide film. As a result, the leakage current flowing between the adjacent device regions can be suppressed.

Japanese patent application laid-open No. 6-140502 discloses a method for making a channel stopper region with a high impurity concentration by the ion implantation after forming field oxide film to suppress the leakage current that may be flown between devices.

However, in the above structure, $p^+$-type high concentration impurity layers as the channel stoppers need to be formed apart from source and drain regions to prevent the reduction in a junction breakdown voltage. Therefore, under the field oxide film between the $p^+$-type high concentration impurity layers and the source and drain regions, a region exists where the channel stopper does not exist and an electric field may be generated due to gate electrodes widely formed on the filed oxide film. In this region, a leakage current path may occur to reduce the characteristics.

Here, if the technique disclosed in Japanese patent application laid-open No. 62-5654 is applied to the above gate array semiconductor device, the integration density will be decreased since the device region must be surrounded by the device separating region with a large occupied area which is composed of thick field oxide film and thin oxide film therebetween in both the X direction and Y direction.

SUMMARY OF THE INVENTION

Accordingly, it is an object of the invention to provide a semiconductor device in which integration density can be improved and leakage current can be sufficiently suppressed.

According to the invention, a semiconductor device, comprises:

a first device-separating insulating film which is formed on a semiconductor substrate and extends in a first(Y) direction;

a second device-separating insulating film which is formed on said semiconductor substrate and extends in a second(x) direction normal to the first(Y) direction;

a first-conductivity-type device region which is formed on the semiconductor substrate and is sectioned by the first and second device-separating insulating films; and a first first-conductive-type high concentration impurity layer which is formed under the first device-separating insulating film and extends in the first(Y) direction;

wherein the second device-separating insulating film is connected with the first device-separating insulating film through an insulating film thinner than both the first and second device-separating insulating films, the thin insulating film extending over the first high concentration impurity layer to separate the device region arranged in the second(X) direction from each other by the first device-separating insulating film and the first high concentration impurity layer, and the device region arranged in the first(Y) direction is separated by the second device-separating insulating film and the thin insulating film.

In accordance with the invention, the thin insulating film is provided between the device regions arranged in the Y direction and on a border region between the first and second device-separating insulating films where the electrodes such as gate electrodes are located nearby. Therefore, even when radioactive rays are radiated thereon, the fixed positive charge accumulated thereon can be reduced to suppress the leakage current flowing between the device regions arranged in the Y direction since the insulating film is sufficiently thin. In addition, the thin insulating film extends over the high concentration impurity layer extending in the Y direction to effectively suppress the leakage current path from the device ends by the thin insulating film and the high concentration impurity layer.

BRIEF DESCRIPTION OF THE DRAWINGS

The invention will be explained in more detail in conjunction with the appended drawings, wherein.

DESCRIPTION OF THE PREFERRED EMBODIMENTS

Before explaining a semiconductor device in the preferred embodiment, the aforementioned conventional semiconductor device will be explained in FIGS. 1 to 2.

Figure 1:
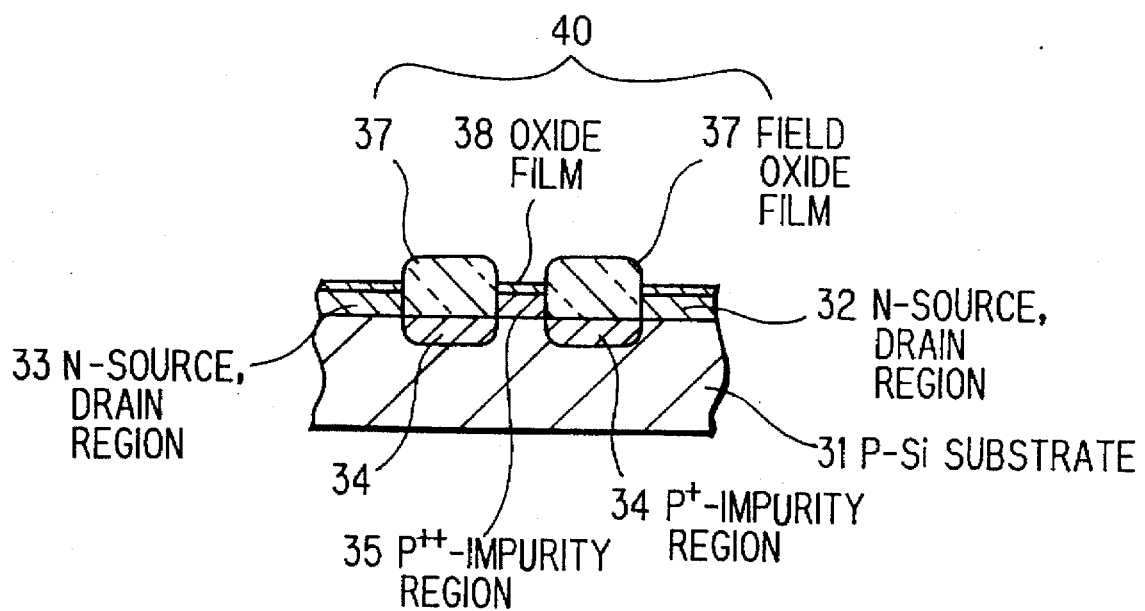
FIG. 1 is a sectional view showing a part of a conventional semiconductor device.

As shown in FIG. 1, the conventional semiconductor device disclosed in Japanese patent application laid-open No. 62-5654 comprises a device separating region 40 which comprises thick field oxide films 37, 37, thin oxide film 38 formed between the thick field oxide films 37, 37, $p^+$-type impurity regions 34, 34 formed under the thick field oxide films 37, 37, and $p^{++}$-type impurity region 35 formed under the thin oxide film 38. The device separating region 40 completely surrounds each device region. Due to this structure, the leakage current flowing between the device region composed of n-type source and drain regions 32 to the right in FIG. 1 and the device region composed of n-type source and drain regions 33 to the left in FIG. 1 can be suppressed.

Figure 2A:
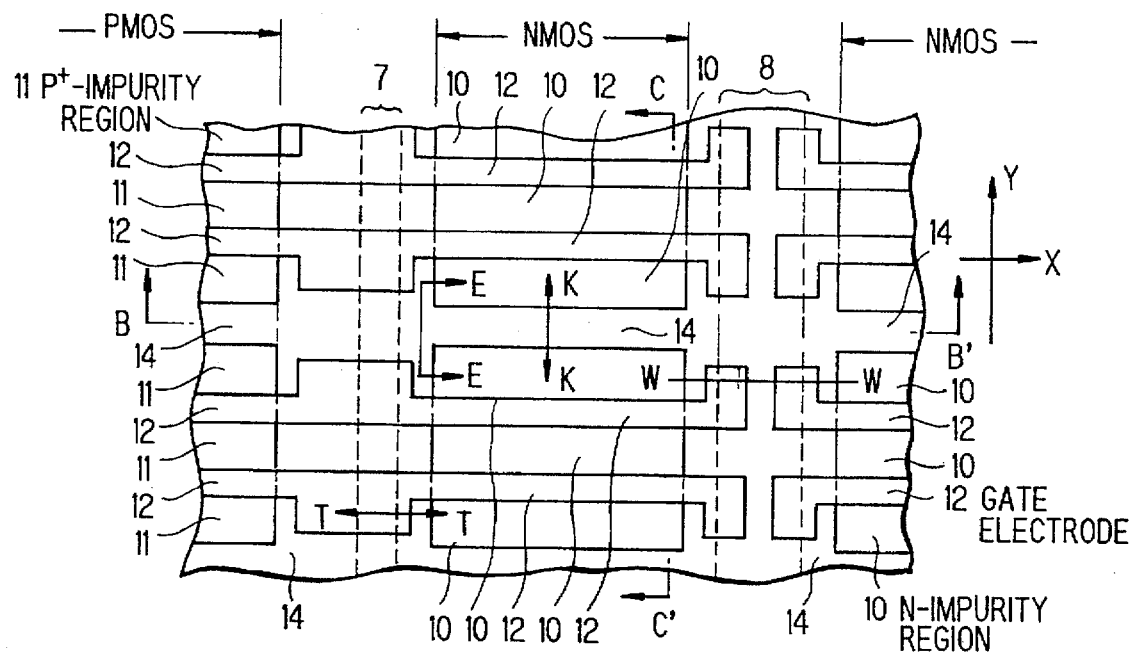
FIG. 2A is a plan view showing another conventional semiconductor device.
Figure 2B:
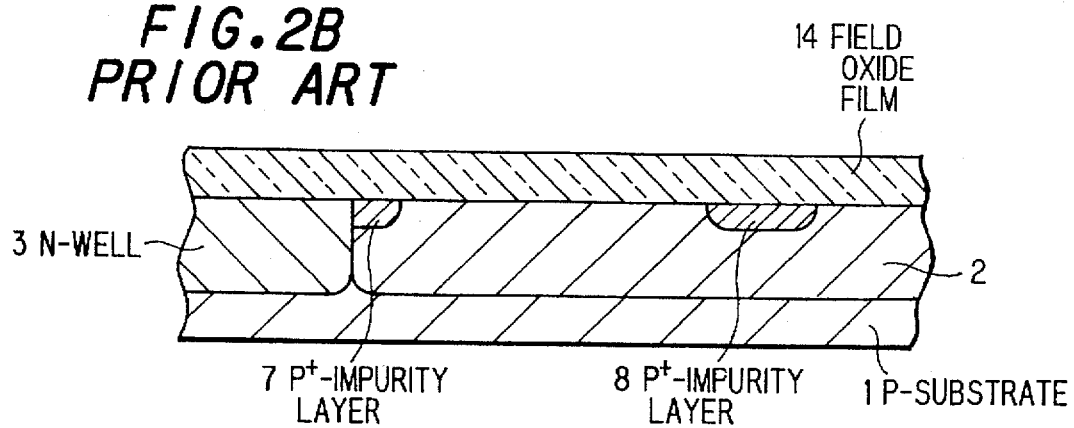
FIG. 2B is a sectional view cut along the line B-B' and viewed in the direction of the arrows B, B' in FIG. 2A.
Figure 2C:
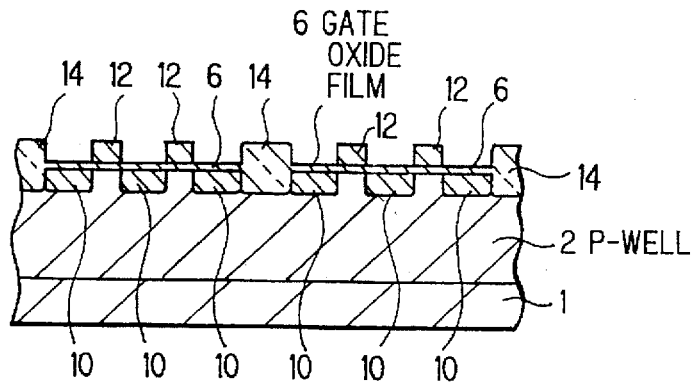
FIG. 2C is a sectional view cut along the line C-C' and viewed in the direction of the arrows C, C' in FIG. 2A.

FIGS. 2A to 2C show another conventional semiconductor device which is disclosed in Japanese patent application laid-open No. 6-140502.

As shown in FIGS. 2B and 2C, a p-type well 2 and a n-type well 3 are formed on a p-type semiconductor substrate 1. Thin gate oxide film 6 is formed on the surface of a device region surrounded by thick field oxide film 14 as device separating film.

In a part of the device separating region on the p-well 2, $p^+$-type impurity layers 7 and 8 of channel stoppers with a high impurity concentration are formed by the ion implantation of p-type impurity through the field oxide film 14 after forming the field oxide film 14. The $p^+$-type high concentration impurity layer 7 is extended in the Y direction on the p-well 2 and adjacent to the n-well 3. The $p^+$-type high concentration impurity layer 8 is extended in the Y direction on the p-well 2 and between NMOSs.

A gate electrode 12, which is formed having a width of a channel region on the gate oxide film 6 in the device region and a wide width on the field oxide film 14 in the device separating region, is extended in the X direction.

A n-type impurity region 10, which is used for a n-type source region and n-type drain region, is formed by the ion implantation where n-type impurity is implanted into the p-well 2 with using the gate electrode 12 as a mask. In the example in FIG. 2, two NMOS transistors comprise three n-type impurity regions 10 and two gate electrodes 12 formed therebetween, which are surrounded by the thick field oxide film 14.

Similarly, a p-type impurity region 11, which is used for a p-type source region and p-type drain region, is formed by the ion implantation where p-type impurity is implanted into the n-well 3 with using the gate electrode 12 as a mask. Two PMOS transistors comprise three p-type impurity regions 11 and two gate electrodes 12 formed therebetween, which are surrounded by the thick field oxide film 14.

In this structure, leakage current paths between adjacent devices may exist, i.e., four paths E—E, T—T, W—W and K—K which are indicated by respective arrows in FIG. 2A.

The arrows T—T show a leakage current path between NMOS and n-type well, and the arrows W—W show a leakage current path between NMOSs arranged in the X direction. These are parasitic channels formed by the electric field of the gate electrode extended on the field oxide film and the electric field of a fixed positive charge in the field oxide film.

In this device, to obtain a desired high impurity concentration channel stopper, the $p^+$-type impurity layers 7 and 8 are formed by the ion implantation of p-type impurity through the field oxide film after forming the field oxide film. Here, the $p^+$-type impurity layers 7 and 8 need to be formed apart from the source and drain regions 10, 10 to prevent the reduction in the junction breakdown voltage.

The arrows K—K show a leakage current path between NMOSs arranged in the Y direction. Even when a fixed positive charge is accumulated by radiating radioactive rays, the parasitic channel can be sufficiently suppressed by providing a channel stopper (not shown) by an usual way since the gate electrode 12 does not exist on the field oxide film 14 near the path.

However, in this structure, $p^+$-type high concentration impurity layers 7, 8 as the channel stoppers need to be formed apart from source and drain regions 10, 10 to prevent the reduction in a junction breakdown. Therefore, under the field oxide film 14 between the $p^+$-type high concentration impurity layers 7, 8 and the source drain regions 10, 10, a region exists where the channel stopper does not exist and an electric field may be generated due to gate electrodes widely formed on the field oxide film 14. In this region, a leakage current path indicated by arrows E—E in FIG. 2A may occur to reduce the characteristics.

Figure 3A:
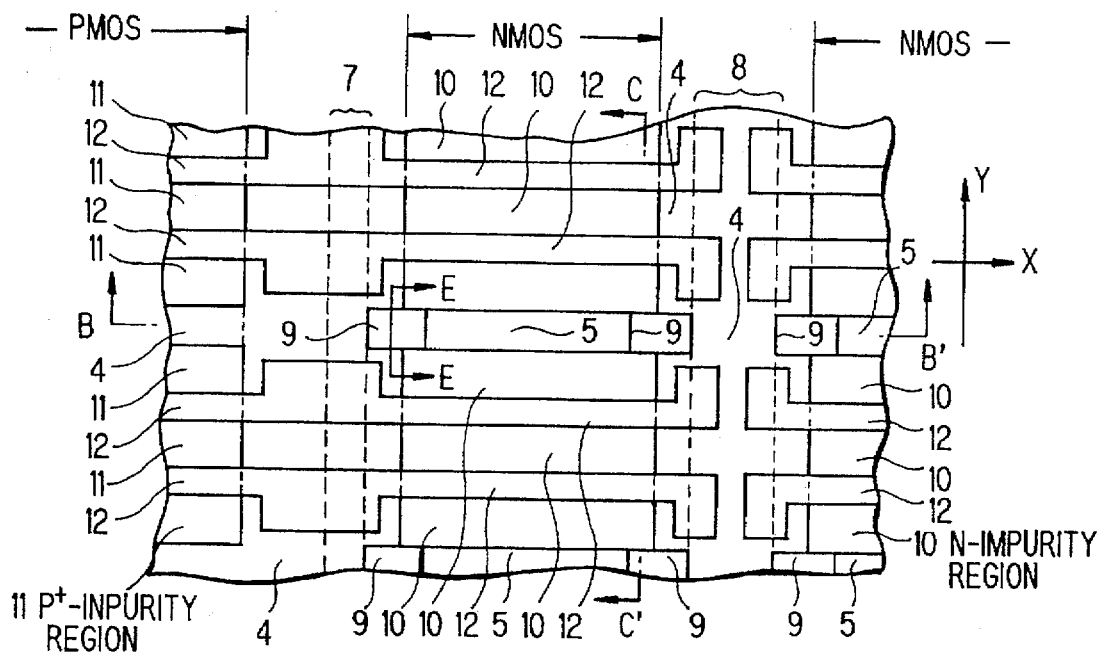
FIG. 3A is a plan view showing a semiconductor device in a first preferred embodiment according to the invention.

Next, a semiconductor device in the first preferred embodiment which is applied to a CMOS gate array will be explained in FIGS. 3A to 3C, wherein like parts are indicated by like reference numerals as used in FIGS. 2A to 2C.

Figure 3B:
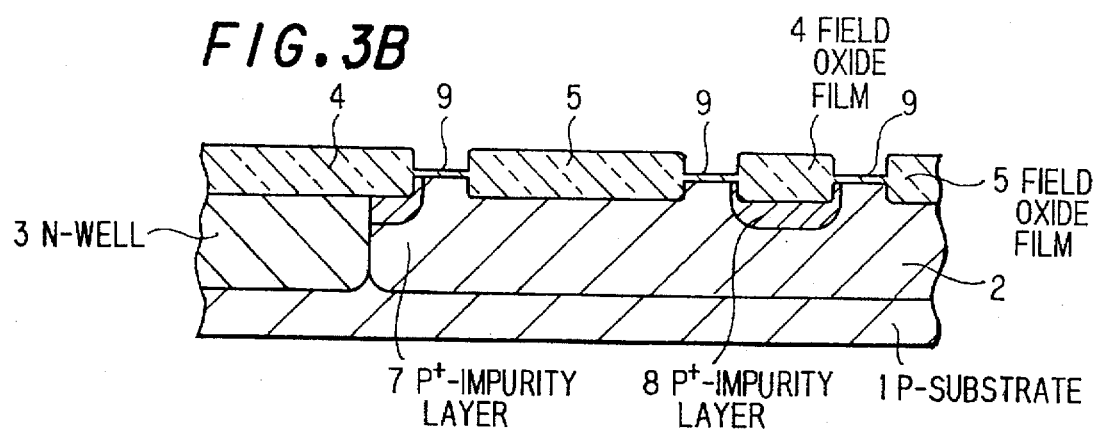
FIG. 3B is a sectional view cut along the line B-B' and viewed in the direction of the arrows B, B' in FIG. 3A.
Figure 3C:
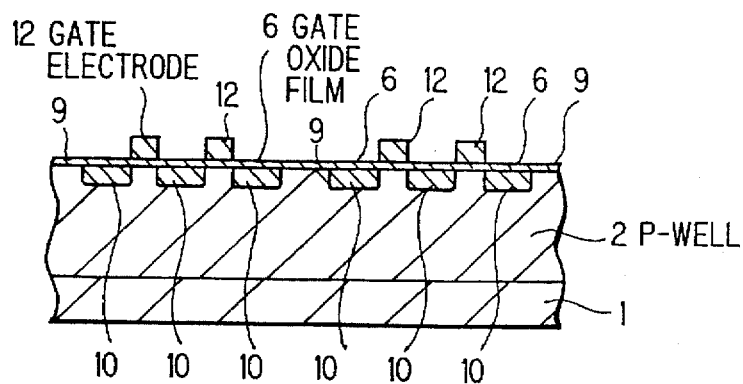
FIG. 3C is a sectional view cut along the line C-C' and viewed in the direction of the arrows C, C' in FIG. 3A.

As shown in FIG. 3B, a p-type well 2 and a n-type well 3 are formed on the main surface of a p-type silicon substrate 1, and thick field silicon oxide films 4 and 5 are formed thereon as a device separating insulation film. The field oxide film 4 is extended in the first direction(=Y direction) to separate devices arranged in the second direction(=X direction). The field oxide film 5 is also extended in the X direction to separate devices arranged in the Y direction. The field oxide films 4 and 5 with the same thickness are simultaneously formed. Thin gate oxide film 6 is formed on the surface of the p-well 2 and n-well 3 in a device region surrounded by the field oxide films 4 and 5.

In a part of the device separating region on the p-well 2, $p^+$-type impurity layers 7 and 8 of channel stoppers with a high impurity concentration are fromed by the ion implementation of p-type impurity through the field oxide film 4 after forming the field oxide films 4 and 5. The $p^+$-type high concentration impurity layer 7 is extended in the Y direction on the p-well 2 and adjacent to the n-well 3. The $p^+$-type high concentration impurity layer 8 is extended in the Y direction on the p-well 2 and between NMOSs.

A gate electrode 12, which is formed having a width(in the Y direction) of a channel region on the gate oxide film 6 in the device region and a wide width(in the Y direction) on the field oxide film 4 in the device separating region, is extended in the X direction.

A n-type impurity region 10, which is used for a n-type source region and n-type drain region, is formed by the ion implantation where n-type impurity is implanted into the p-well 2 with using the gate electrode 12 as a mask. In the first embodiment, two NMOS transistors comprise three n-type impurity regions 10 and two gate electrodes 12 formed therebetween, which are surrounded by thick field oxide film 14.

Similarly, a p-type impurity region 11, which is used for a p-type source region and p-type drain region, is formed by the ion implantation where p-type impurity is implanted into the n-well 3 with using the gate electrode 12 as a mask. Two PMOS transistors comprise three p-type impurity regions 11 and two gate electrodes 12 formed therebetween, which are surrounded by thick field oxide film 14.

In this embodiment, thin silicon oxide film 9 with the same thickness as the gate oxide film 6 is simultaneously formed with the gate oxide film 6 on the border region between the thick field oxide film 4 extending in the Y direction and the field oxide film 5 extending in the X direction. The thin silicon oxide film 9 is formed by breaking a part of the thick field oxide film 4 to reach the p$^+$-type high concentration impurity layers 7 and 8.

By forming the thin silicon oxide film 9, the field oxide films 4 and 5 are separated by the thin silicon oxide film 9 which reaches the p$^+$-type high concentration impurity layer 7 or 8, between two NMOS device regions 10 and 10 which are adjacent through the field oxide film 5. Therefore, even when radioactive rays are radiated, the fixed positive charge is not so accumulated since the silicon oxide film 9 is sufficiently thin. As a result, the leakage current flowing between the device regions arranged in the Y direction can be suppressed to prevent the occurrence of the leakage current path as indicated by arrow E—E in FIG. 3A.

A semiconductor device in the second preferred embodiment which is applied to a CMOS gate array will be explained in FIGS. 4A to 4C, wherein like parts are indicated by like reference numerals as used in FIGS. 3A to 3C.

Figure 4A:
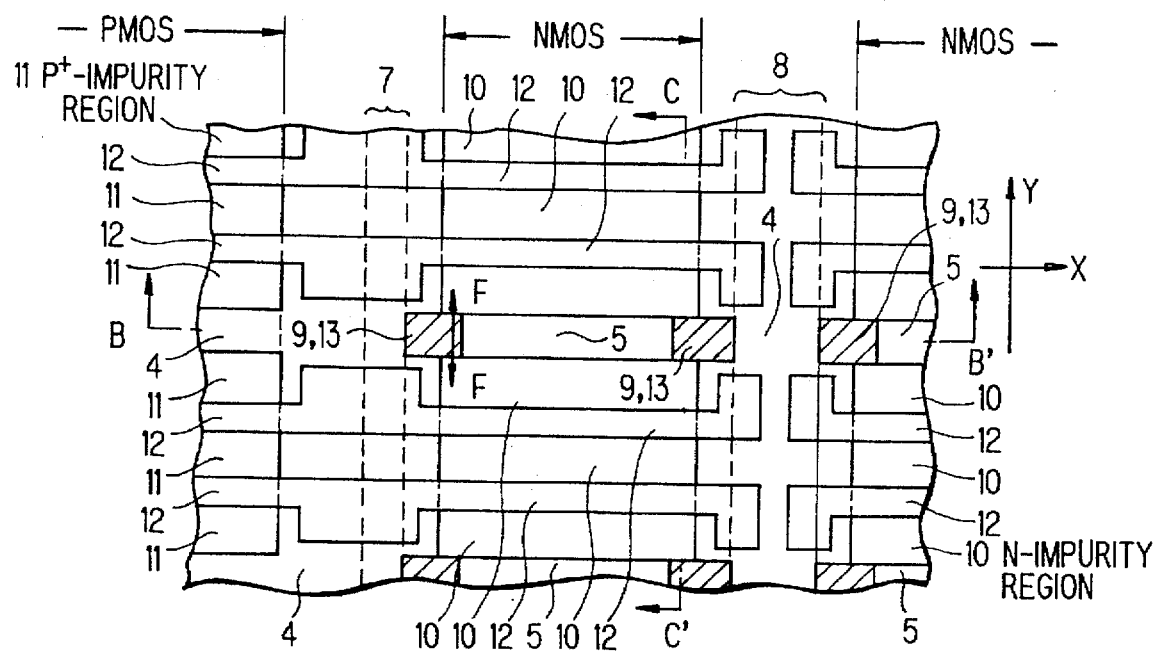
FIG. 4A is a plan view showing a semiconductor device in a second preferred embodiment according to the invention.
Figure 4B:
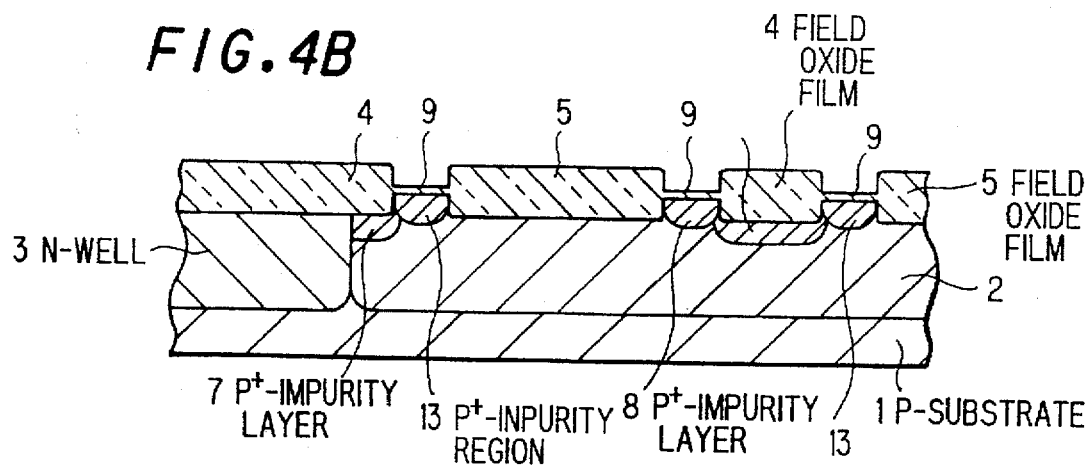
FIG. 4B is a sectional view cut along the line B-B' and viewed in the direction of the arrows B, B' in FIG. 4A.
Figure 4C:
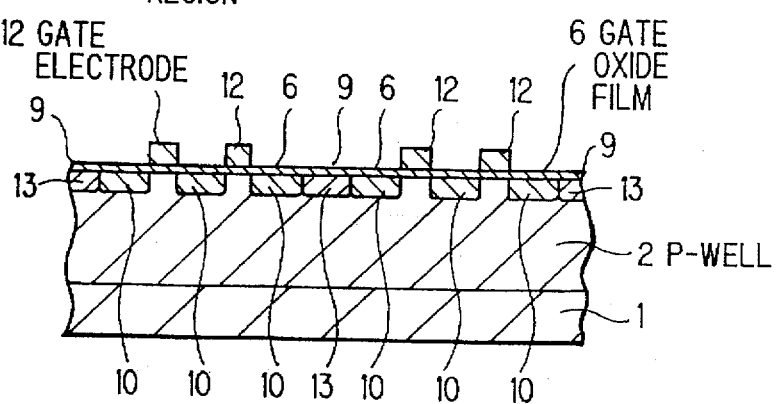
FIG. 4C is a sectional view cut along the line C-C' and viewed in the direction of the arrows C, C' in FIG. 4A.

In the second embodiment, a p$^+$-type impurity region 13 is, as more clearly shown in FIGS. 4B and 4C, formed under a thin silicon oxide film 9. The p$^+$-type impurity region 13 is also indicated by oblique lines in FIG. 4A.

The impurity concentration of the p$^+$-type impurity region 13 is greater than that of a substrate (a concentration of a p-well 2) to function as a channel stopper and is less than that of p$^+$-high concentration impurity regions 7 and 8 to prevent the reduction in the junction breakdown voltage.

When a metal wiring is laid on the thin silicon oxide film 9, a parasitic transistor may be formed using the metal wiring as a gate to cause the leakage current as indicated by arrows F—F in FIG. 4A. In this case, by providing the p$^+$-type impurity region 13 under the thin silicon oxide film 9 to increase the threshold voltage of the parasitic transistor, the leakage current as indicated by the arrows F—F can be suppressed. A semiconductor device in the third preferred embodiment which is applied to a CMOS gate array will be explained in FIGS. 5A to 5C, wherein like parts are indicated by like reference numerals as used in FIGS. 3A to 4C.

Figure 5A:
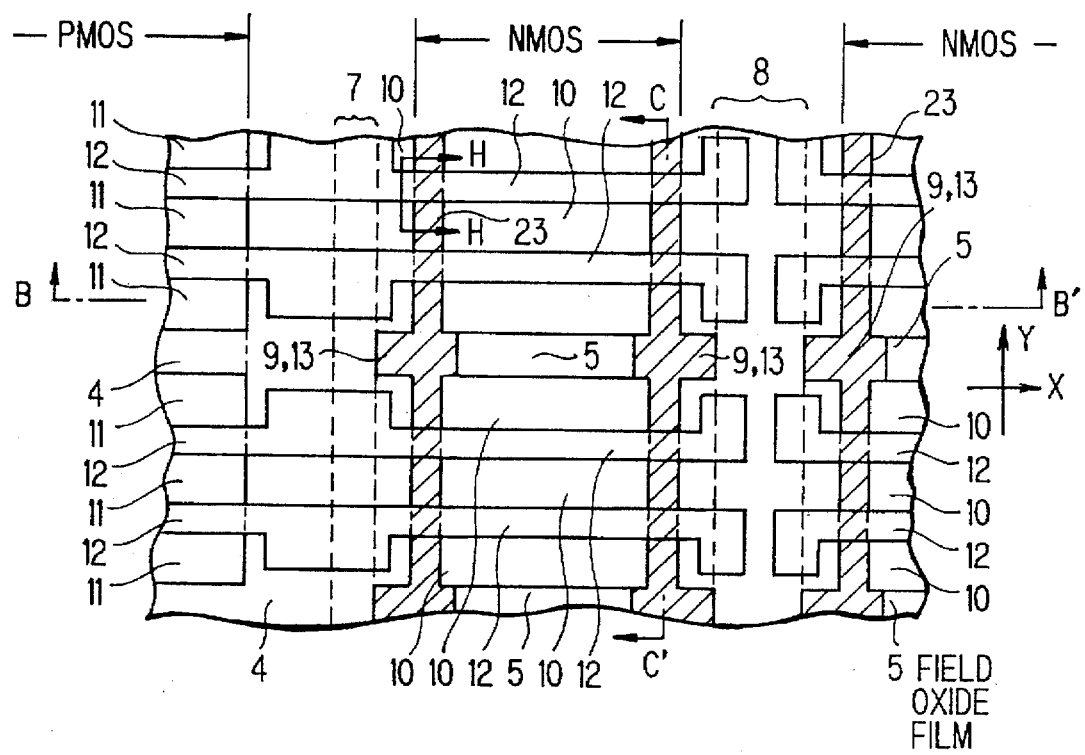
FIG. 5A is a plan view showing a semiconductor device in a third preferred embodiment according to the invention.
Figure 5B:
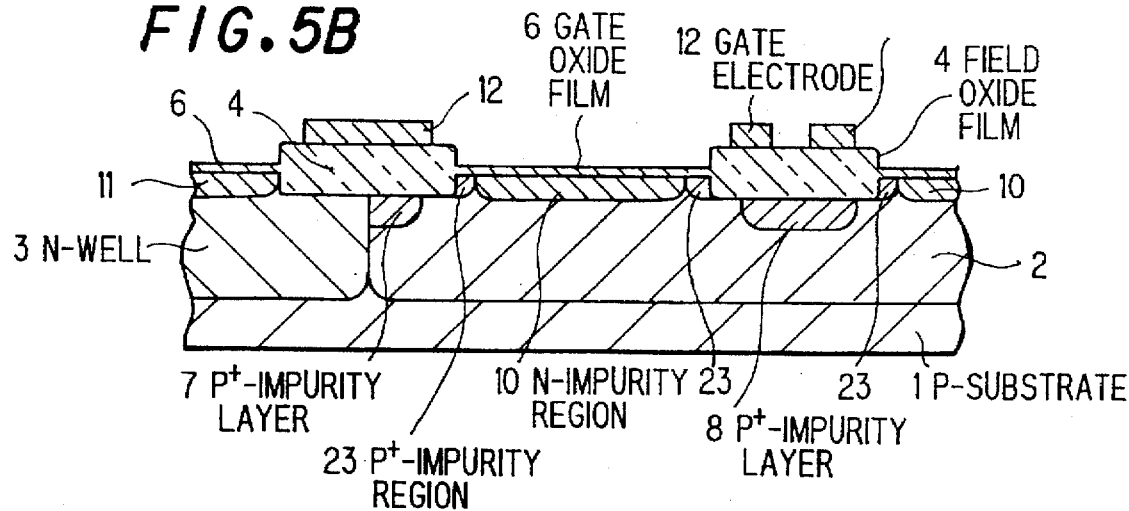
FIG. 5B is a sectional view cut along the line B-B' and viewed in the direction of the arrows B, B' in FIG. 5A
Figure 5C:
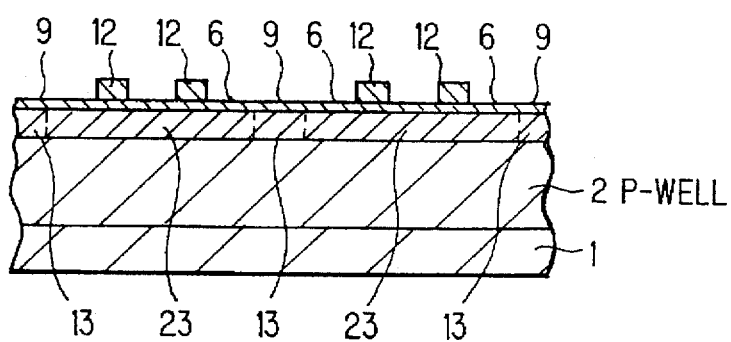
FIG. 5C is a sectional view cut along the line C-C' and viewed in the direction of the arrows C, C' in FIG. 5A.

In the third embodiment, a p$^+$-type impurity region 23 is, as more clearly shown in FIGS. 5B and 5C, formed extending in the Y direction under a thin silicon oxide film 9 and on both ends in the gate width direction(=X direction) of n-type source and drain regions 10, 10. The p$^+$-type impurity region 23 is also indicated by oblique lines in FIG. 5A.

Thus, as shown in FIG. 5C, the p$^+$-type impurity region 23 is continuously formed along the ends in the width direction of the n-type source and drain regions 10, 10, from the p$^+$-type impurity region 13 under the thin oxide film 9.

The p$^+$-type impurity region 23 serves to prevent the leakage current as indicated by arrows H—H in FIG. 5A which may flow under the ends of field oxide film 4 and between the source and drain of the same NMOS. Namely, the p$^+$-type impurity region 23 can prevent the leakage current H—H as well as the leakage current E—E and the leakage current F—F as described in the first embodiment and the second embodiment, respectively.

Similarly to the case of the p$^+$-type impurity region 13 in the second embodiment, the impurity concentration of the p$^+$-type impurity region 23 is greater than that of a substrate (a concentration of a p-well 2) to serve as a channel stopper and is less than that of p$^+$-high concentration impurity regions 7 and 8 to prevent the reduction in the junction breakdown voltage.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, comprising:

a first device-separating insulating film which is formed on a semiconductor substrate and extends in a first direction;

a second device-separating insulating film which is formed on a semiconductor substrate and extends in a second direction normal to said first direction;

a first-conductivity-type device region which is formed on said semiconductor substrate and is sectioned by said first and second device-separating insulating films; and a first first-conductive-type high concentration impurity layer which is formed under said first device-separating insulating film and extends in said first direction;

wherein said second device-separating insulating film is connected with said first device-separating insulating film through an insulating film thinner than both said first and second device-separating insulating films, said thin insulating film extending over said first high concentration impurity layer to separate said device region arranged in said second direction from each other by said first device-separating insulating film and said first high concentration impurity layer, and said device region arranged in said first direction is separated by said second device-separated insulating film and said thin insulating film.

2. A semiconductor device, according to claim 1, wherein:

said device region includes an insulated-gate field-effect transistor which comprises second conductivity-type source and drain regions and a gate electrode which extends in said second direction through a gate insulating film on a channel region between said source and drain regions, and a thickness of said thin insulating film is nearly equal to that of said gate insulating film.

3. A semiconductor device, according to claim 2, further comprising:

a second first-conductivity-type impurity layer which is formed under said thin insulating film and has an impurity concentration higher than said first-conductivity-type device region and lower than said first high concentration impurity layer under said first device-separating insulating film.

4. A semiconductor device, according to claim 3, wherein:
said second first-conductivity-type impurity layer continuously extends in said first direction along both ends in second direction of said source and drain regions under said thin insulating film.

5. A semiconductor device, according to claim 1, further comprising:
a second first-conductivity-type impurity layer which is formed under said thin insulating film and has an impurity concentration higher than said first-conductivity-type device region and lower than said first high concentration impurity layer under said first device-separating insulating film.

6. A semiconductor device, according to claim 5, wherein:
said second first-conductivity-type impurity layer continuously extends in said first direction along both ends in second direction of said source and drain regions under said thin insulating film.

* * * * *